(12) United States Patent
Berge et al.

(10) Patent No.: US 6,704,901 B1
(45) Date of Patent: Mar. 9, 2004

(54) RUNTIME PROGRAMMABLE REED-SOLOMON DECODER

(75) Inventors: Torkjell Berge, Moscow, ID (US); Aaron James Brennan, Deary, ID (US)

(73) Assignee: AMI Semiconductor, Inc., Pocatello, ID (US)

( * ) Notice: Subject to any disclaimer, the term of this patent is extended or adjusted under 35 U.S.C. 154(b) by 614 days.

(21) Appl. No.: 09/613,471

(22) Filed: Jul. 11, 2000

(51) Int. Cl.[7] .......................... H03M 13/00; G06F 15/00
(52) U.S. Cl. ........................ 714/784; 708/492
(58) Field of Search ............................ 714/781, 784, 714/785, 746, 752, 756, 809, 810; 708/492, 530

(56) References Cited

U.S. PATENT DOCUMENTS

| | | | | | |
|---|---|---|---|---|---|
| 5,297,153 | A | * | 3/1994 | Baggen et al. | 714/782 |
| 5,396,502 | A | * | 3/1995 | Owsley et al. | 714/784 |
| 5,905,740 | A | * | 5/1999 | Williamson | 714/784 |
| 6,374,383 | B1 | * | 4/2002 | Weng | 714/781 |
| 6,487,691 | B1 | * | 11/2002 | Katayama et al. | 714/784 |

* cited by examiner

Primary Examiner—Christopher T. Tu
(74) Attorney, Agent, or Firm—Renner, Otto, Boisselle & Sklar, LLP

(57) ABSTRACT

A runtime programable RS decoder that can operate on multiple pieces of data during one clock cycle in order to generate, reduce, and evaluate polynomials involved in the decoding of an RS code, and which allows a user to choose the RS code after the circuit has been implemented.

20 Claims, 12 Drawing Sheets

FOUR WORDS PER CLOCK

$O = I \oplus [A \cdot B]$

RUNTIME PROGRAMMABLE REED-SOLOMON DECODER

FIELD OF THE INVENTION

The present invention relates to Reed-Solomon (RS) decoders. More particularly, the present invention relates a runtime programable RS decoder that can operate on multiple pieces of data during one clock cycle in order to generate, reduce, and evaluate polynomials involved in the decoding of an RS code, and which allows a user to choose the RS code after the circuit has been implemented.

BACKGROUND OF THE INVENTION

RS codes are used in many applications where data is transferred from one system to another. These applications include Digital Subscriber Lines (xDSL), digital television, asynchronous transfer mode (ATM) communications, tape drives, compact discs (CDs), digital versatile discs (DVDs), and so on. The decoding of RS error correcting codes requires the calculation of several polynomials with coefficients in a finite Galois Field (GF). These polynomials are generally known as the syndrome polynomial, the error evaluator polynomial ($\Omega(x)$ polynomial) and the error locator polynomial ($\Lambda(x)$ polynomial). Conventional designs for computing these polynomials required circuitry that was generally limited to operating on one byte at a time for the computation of each of these polynomials, such as shown in U.S. Pat. No. 5,396,502 (hereinafter the '502 patent). The '502 patent describes an Error Correction Unit (ECU) that uses a single stack embodiment for the generation, reduction and evaluation of the polynomials involved in the decoding of an RS code. The circuit uses the same hardware to generate the syndromes, reduce the $\Omega(x)$ and $\Lambda(x)$ polynomials and evaluate the $\Omega(x)$ and $\Lambda(x)$ polynomials, but is limited to operating on one byte per clock cycle. The disclosure of the '502 patent is hereby incorporated herein in its entirety.

Additionally, RS decoders in the past were typically limited to being able to decode only a particular RS code. It was not possible with such RS decoders to choose the code after the circuit was implemented so as to enable use in multiple applications without predetermining the RS code. Such decoders did not allow a user the flexibility to change the RS code as desired without having to replace the RS decoder.

In view of the aforementioned shortcomings associated with conventional RS decoders, there is a strong need in the art for an RS decoder which is not limited to operating on one byte per clock cycle. Moreover, there is a strong need in the art for an RS decoder which is not limited in operation based on a set predefined RS code.

SUMMARY OF THE INVENTION

The RS decoder of the present invention provides improved operation compared to conventional RS decoders. According to the present invention, an RS decoder is provided which is able to operate on two or more words per clock cycle. Such a feature will reduce the decoding time to a point approaching the time it takes to generate the $\Lambda$ and $\Omega$ polynomials. In addition, the RS decoder is runtime programmable, which allows a user to change the codefield after the circuit has been implemented (i.e. "on the fly.")

More particularly, the present invention is a decoder circuit for decoding an input word stream which includes a plurality of Reed-Solomon encoded data segments. The decoder circuit includes at least one computation unit for receiving the input bit stream, resolving coefficients of a syndrome polynomial, generating an $\Omega(x)$ polynomial, generating a $\Lambda(x)$ polynomial, and generating a $\Lambda'(x)$ polynomial, and for outputting an evaluated $\Omega(x)$ polynomial and an evaluated $\Lambda(x)$ polynomial, each of these polynomials having a plurality of data words which the computation unit can resolve multiple words at a time. The decoder circuit has at least one register file for receiving data and storing the intermediate processed coefficients of the syndrome polynomial, the $\Omega(x)$ polynomial, the $\Lambda(x)$ polynomial, and the $\Lambda'(x)$ polynomial. Additionally, the decoder circuit has at least one division unit for evaluating the $\Omega(x)$ and $\Lambda(x)$ polynomials and for producing an output word stream of decoded data segments.

Additionally, the computation unit of FIG. 1 has a general GF multiplier, which uses a primitive element of the field as an input. This allows the user to change the field "on the fly." Traditional GF multipliers are polynomial specific, and if implemented in an ASIC or ASSP can only handle one field. The current invention allows the user to decode data encoded in any RS code of bit width less than a defined maximum, as long as the defining parameters of the code are known. Likewise, the GF multiplier can handle codes of lesser bit widths than the maximum defined by the size of the multipliers.

DETAILED DESCRIPTION OF THE INVENTION

Circuit Configuration

Figure 1:
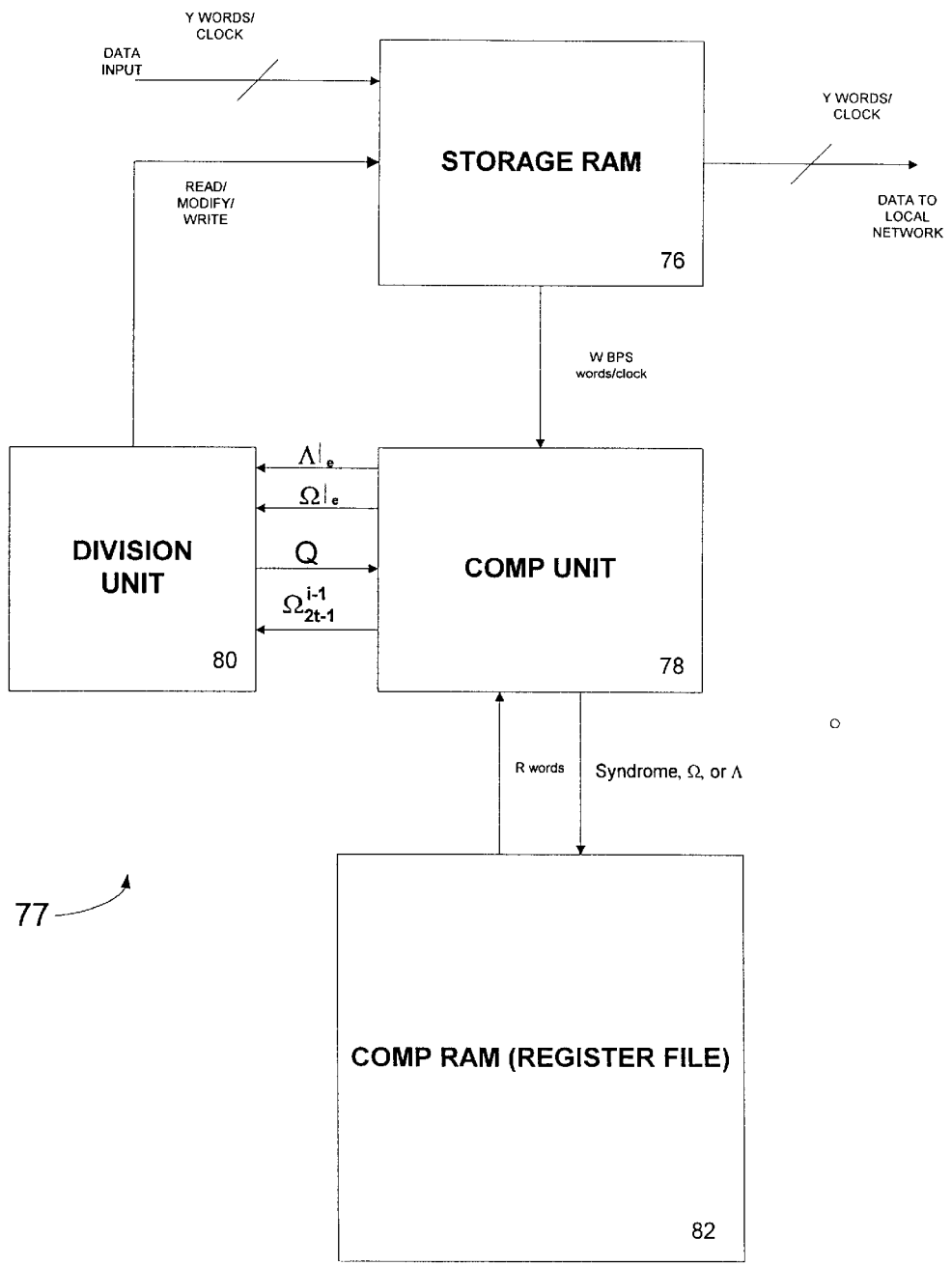
FIG. 1 is a top level block diagram of the first embodiment of the RS decoder of the present invention. The RS decoder can be broken into four main units which are labeled Storage Ram (RAM), Comp Unit (Computation Unit), Comp RAM (Register File) and Division Unit.

FIG. 1 shows a block diagram of the first embodiment of the present invention. In the preferred embodiment, a Y words per clock bus is coupled to a storage RAM (RAM) 76 which serves as a data input for a RS decoder circuit 77. The storage RAM 76 is coupled via a words per step (BPS) bus, W, to a computation unit (comp unit) 78. The comp unit 78 is coupled to receive a Q input from a division unit 80 and a $\Lambda(x)$ evaluation constant, a syndrome constant, an $\Omega(x)$ evaluation constant, an a output, a b output from a computation RAM (register file) 82 via a R words bus. The comp unit 78 is coupled to replace the contents of the register file 82 with the syndrome, the $\Omega$, and the $\Lambda$ polynomials. Comp unit 78 is coupled to provide $\Omega_{2t-1}^{i-1}$, $\Omega$ evaluated, and $\Lambda$ evaluated to division unit 80. Division unit 80 is coupled to provide a read/modify/write input to RAM 76. Finally, a Y words per clock bus is coupled from the RAM 76 to provide a data output from the RS decoder circuit 77 to a local data sink. A control circuit (not shown) is coupled to control a flow of data through the RS decoder circuit of the present invention.

RAM 76 is any form of RAM that allows data to be read and written without slowing down an application. In some cases, dual (or multi) port RAMs may be needed.

Figure 2:
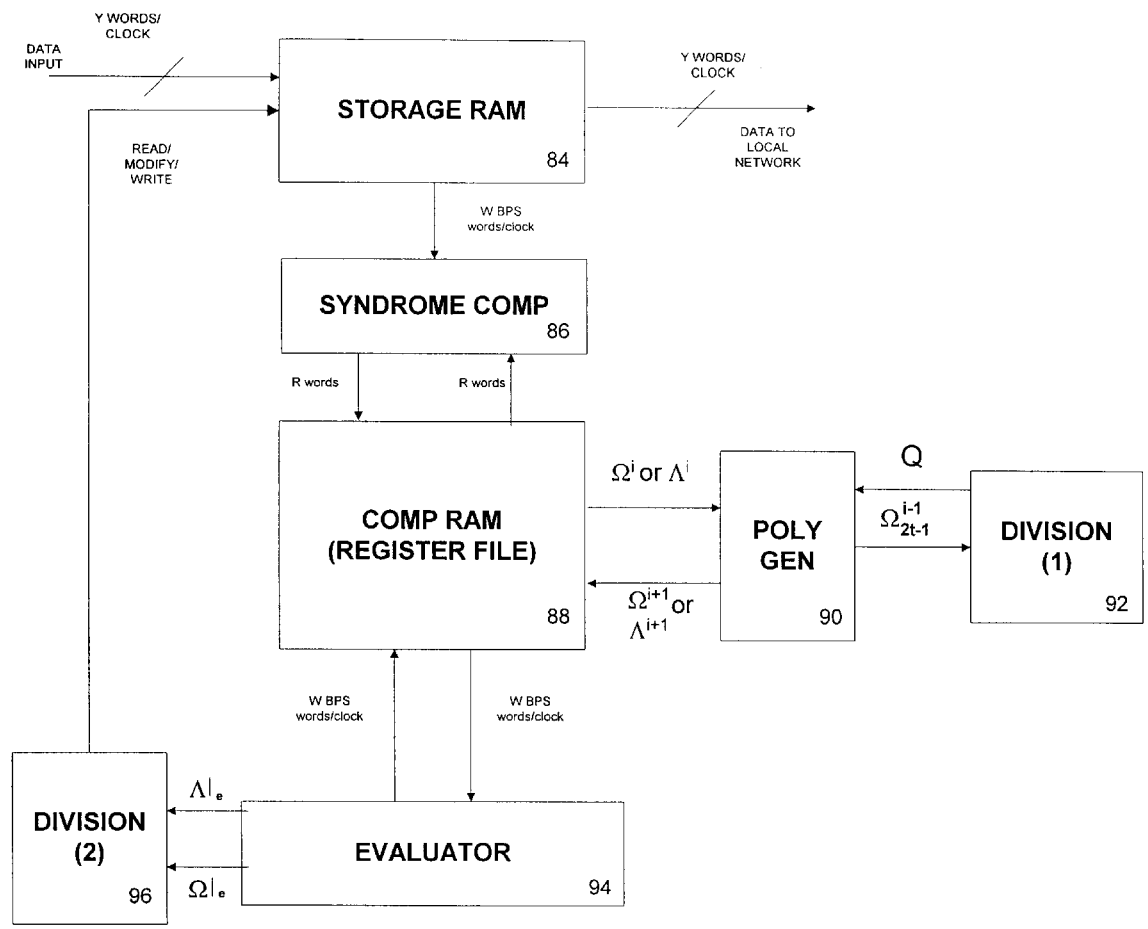
FIG. 2 is a top level block diagram of the second embodiment of the RS decoder of the present invention. In this embodiment, the RS decoder can be broken into seven main units which are labeled Storage Ram (RAM), Syndrome Comp (Syndrome Computation Unit), Comp RAM (Register File), Polygen (Polynomial Generation Unit) and Division (1), Evaluator, and Division (2).

FIG. 2 shows a block diagram of the second embodiment of the present invention. In the second embodiment, a Y words per clock bus is coupled to a storage RAM (RAM) 84 which serves as a data input for a RS decoder circuit 85. RAM 84 is coupled via a Y words per step (BPS) bus to a syndrome computation unit (syndrome comp) 86. Syndrome comp 86 is coupled to receive input from and to provide output to a computation RAM (register file) 88 via R words wide buses. Register file 88 is coupled to provide $\Omega^i$ or $\Lambda^i$ to polynomial generation unit (polygen) 90 and to receive $\Omega^{i+1}$ or $\Lambda^{i+1}$ from polygen 90. Polygen 90 is coupled to provide $\Omega^{i+1}_{2t-1}$ as an input to Division (1) 92. Division (1) 92 is coupled to input Q to polygen 90. Register file 88 is coupled to receive input from and to provide output to evaluator 94 via two BPS buses. Evaluator 94 is coupled to provide $\Omega$ evaluated, and $\Lambda$ evaluated as inputs to division (2) 96. Division (2) 96 is coupled to provide a read/modify/write input to RAM 84. Finally, a Y words per clock bus is coupled from the RAM 84 to provide a data output from a RS decoder circuit 85 to a local network. As in FIG. 1, a control circuit (not shown) is coupled to control a flow of data through an RS decoder circuit of the present invention.

The polygen 90 is similar to polynomial generation units described in the prior art ('502) with the major exception being that the registers are now part of register file 88.

Division (1) 92, is as described in end cell 24 in Owsley, et. al. U.S. Pat. No. 5,396,502.

Figure 3:
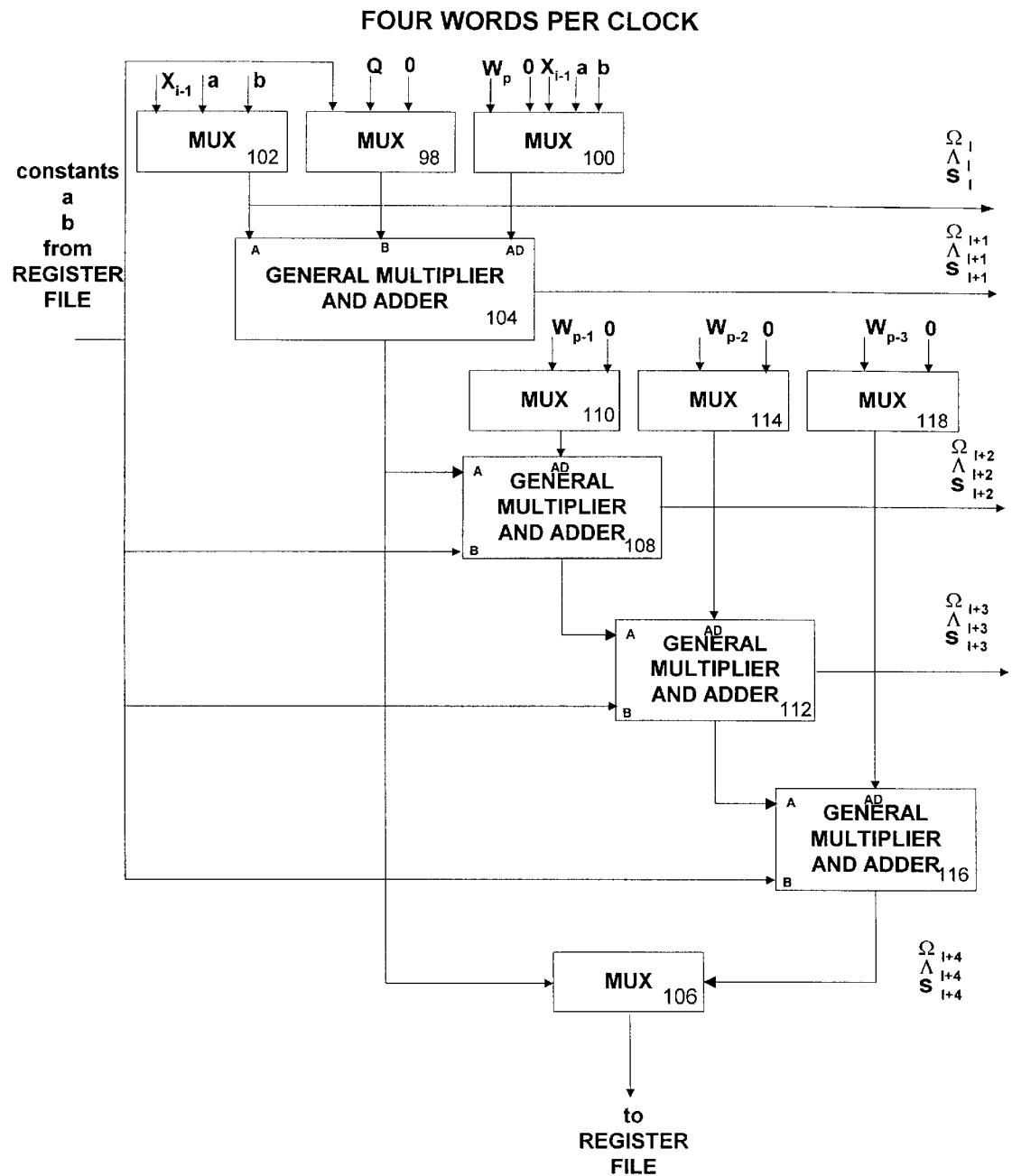
FIG. 3 is a more detailed block diagram of the computation unit of the present invention set up to handle four words per clock.

FIG. 3 shows a detailed block diagram of the comp unit 78 of the present invention. A Q word, and a zero are coupled as inputs to multiplexor 98. Multiplexor 98 is also coupled to receive an input from register file 82. This input could be one of the following inputs: an $\Omega$ evaluation constant, a $\Lambda$ evaluation constant, or a syndrome constant or input a (the current polynomial), or b (the previous polynomial). Multiplexor 100 is coupled to receive inputs a (the current polynomial), b (the previous polynomial), and $X_{i-1}$ (a shifted version of the a input) all from the register file 82, and input $W_p$ (input from RAM 76), and zero. $X_{i-1}$, a and b, all from the register file 82, are coupled as inputs to a multiplexor 102. The outputs of multiplexors 98, 100, and 102 are coupled to provide input data to a general multiplier/adder 104. The output of multiplexor 102 is coupled to provide $\Omega_i$ and $\Lambda_i$ to an evaluation logic unit (evaluation logic) 120 (shown in FIG. 8). The output of general multiplier/adder 104 is coupled as an input to a multiplexor 106 and to a general multiplier/adder 108. General multiplier/adder 104 is coupled to provide $\Omega_{i+1}$ and $\Lambda_{i+1}$ to evaluation logic 120 (shown in FIG. 8). Multiplexor 106's output is coupled to replace syndrome, $\Omega$ or $\Lambda$ data in register file 82.

General multiplier/adder 108 is coupled to receive an input from register file 82 which could be any of the constant inputs listed above that multiplexor 98 is coupled to receive from register file 82. General multiplier/adder 108 is also coupled to receive an input from multiplexor 110 which is coupled to receive inputs $W_{p-1}$ and zero. One output of general multiplier/adder 108 is coupled as an input to general multiplier/adder 112. The other output of general multiplier/adder 108 is coupled to provide $\Omega_{i+2}$ and $\Lambda_{i+2}$ to evaluation logic 120 (shown in FIG. 8).

General multiplier/adder 112 is coupled to receive an input from register file 82 which could be any of the constant inputs listed above that multiplexor 98 is coupled to receive from register file 82. General multiplier/adder 112 is also coupled to receive an input from multiplexor 114 which is coupled to receive inputs $W_{p-2}$ and zero. One output of general multiplier/adder 112 is coupled as an input to general multiplier/adder 116. The other output of general multiplier/adder 112 is coupled to provide $\Omega_{i+3}$ and $\Lambda_{i+3}$ to evaluation logic 120 (shown in FIG. 8).

General multiplier/adder 116 is coupled to receive an input from register file 82 which could be any of the constant inputs listed above that multiplexor 98 is coupled to receive from register file 82. General multiplier/adder 116 is also coupled to receive an input from multiplexor 118 which is coupled to receive inputs $W_{p-3}$ and zero. The $\Omega_{i+4}$ and $\Lambda_{i+4}$ outputs of general multiplier/adder 116 are coupled as an input to multiplexor 106. Multiplexor 106's output is coupled to replace the syndrome, $\Omega$ and $\Lambda$ data in register file 82.

It is assumed that one of the values in the register file is "00". This circuit performs all the operations done individually in the prior art circuits. However, when more than one word is handled per clock, the output of the circuit above is fed to the next stage as the "A" input to the coupled general multiplier/adder and only the last output is fed back to the register file 82.

Figure 4:
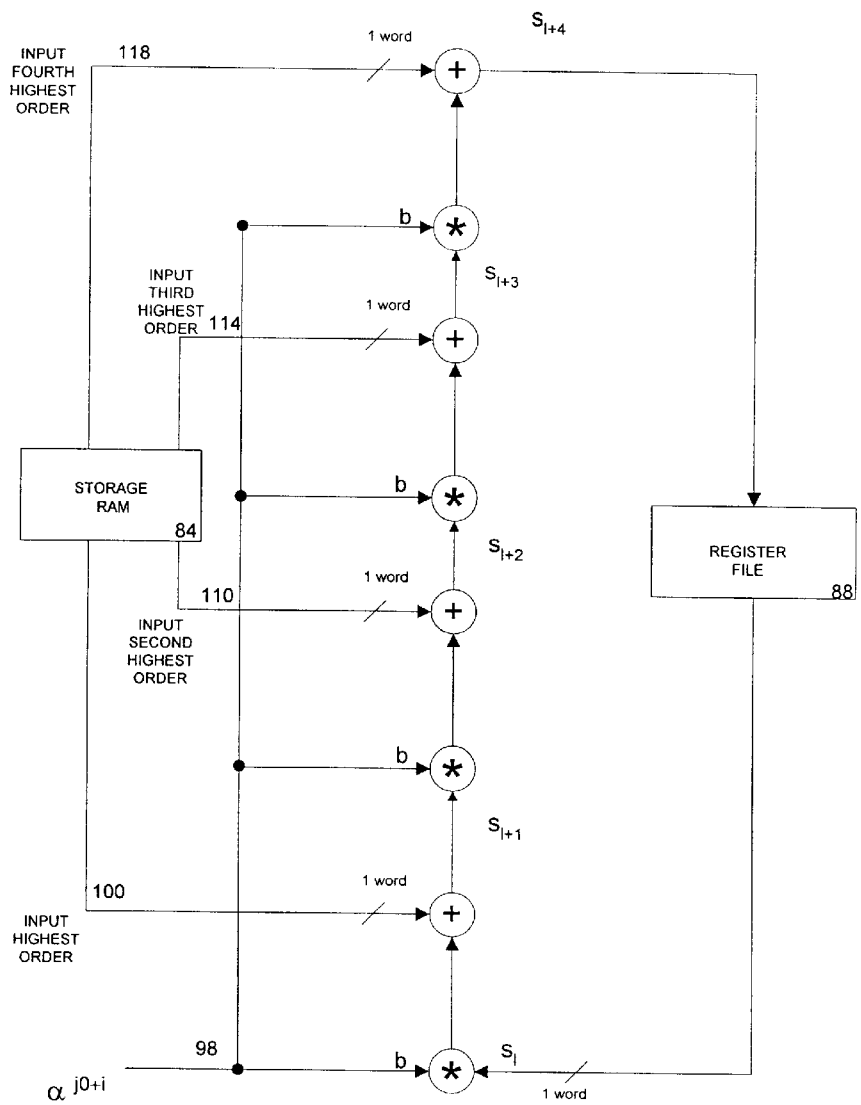
FIG. 4 is a more detailed block diagram of the syndrome computation unit of the present invention set up to handle four words per clock.

FIG. 4 shows the connections for generating syndromes using four words per clock. The actual connections in reference to comp unit 78 (FIG. 3) are as follows: multiplexor 98 couples the syndrome constant and multiplexor 102 couples the input a (can be either the current syndrome from register file 82 of FIG. 1 or from register file 88 of FIG.

2 depending on the configuration) to the B and A inputs respectively, of a general GF multiplier of general multiplier/adder 104 for forming a product. Input $W_p$ (the highest order input data IN for syndrome generation from RAM 76 FIG. 3) is coupled to an adder (AD) input of general multiplier/adder 104 through a multiplexor 100 to be added with a product output from the general GF multiplier of general multiplier/adder 104. A sum output of general multiplier/adder 104 is current syndrome ($S_{i+1}$) The current syndrome ($S_{i+1}$) and the syndrome constant (from either register file 82 of FIG. 1 or from register file 88 of FIG. 2 depending on the configuration) are coupled as the A and B inputs, respectively, to the general GF multiplier of general multiplier/adder 108 for forming a product. The input $W_{p-1}$ (the second highest order input data IN for syndrome generation from RAM 76) is coupled to the adder (AD) input of general multiplier/adder 108 through the multiplexor 110 to be added with the product output from the general GF multiplier of general multiplier/adder 108. The sum output of general multiplier/adder 108 is the current syndrome ($S_{i+2}$). The current syndrome ($S_{i+2}$) and the syndrome constant (either the current syndrome from register file 82 of FIG. 1 or from register file 88 of FIG. 2 depending on the configuration) are coupled as the A and B inputs, respectively, to the general GF multiplier of general multiplier/adder 112 for forming a product. The input $W_{p-2}$ (the third highest order input data IN for syndrome generation from RAM 76) is coupled to the adder (AD) input of general multiplier/adder 112 through the multiplexor 114 to be added with the product output from the general GF multiplier of general multiplier/adder 112. The sum output of general multiplier/adder 112 is the current syndrome ($S_{i+3}$). The current syndrome ($S_{i+3}$) and the syndrome constant (either the current syndrome from register file 82 of FIG. 1 or from register file 88 of FIG. 2 depending on the configuration) are coupled as the A and B inputs, respectively, to the general GF multiplier of general multiplier/adder 116 for forming a product. The input $W_{p-3}$ (the fourth highest order input data IN for syndrome generation from RAM 76) is coupled to the adder (AD) input of general multiplier/adder 116 through the multiplexor 118 to be added with the product output from the general GF multiplier of general multiplier/adder 116. The sum output of general multiplier/adder 116 is coupled as the current syndrome input of multiplexor 106. The multiplexor 106 output is coupled to replace the current syndrome data in register file 82 (or register file 88 of FIG. 2 depending on the configuration).

In generating the syndrome using only one word per clock the connections in comp unit 78 (FIG. 3) are as follows: multiplexor 98 couples the syndrome constant and multiplexor 102 couples the input a (current syndrome from register file 82 of FIG. 1 or from reg to the B and A inputs, respectively, of the general GF multiplier of general multiplier/adder 104 for forming a product. The input $W_p$ (which is the input data IN for syndrome generation) is coupled to the adder (AD) input of general multiplier/adder 104 through the multiplexor 100 to be added with the product output from the general GF multiplier of general multiplier/adder 104. The sum output of general multiplier/adder 104 is coupled as an input to multiplexor 106. Multiplexor 106's output is coupled to replace the syndrome data in register file 82 (or register file 88 of FIG. 2 depending on the configuration).

Figure 5:
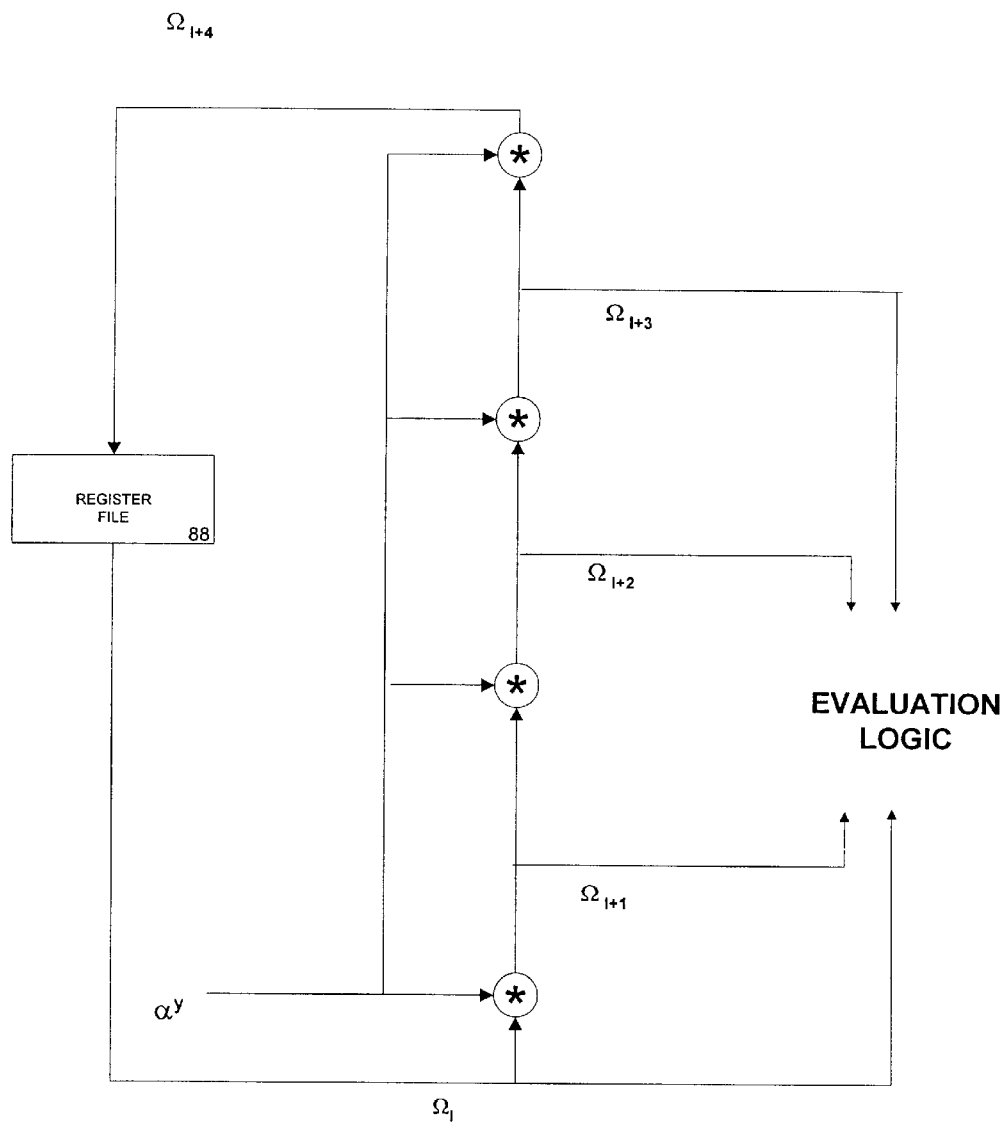
FIG. 5 is a more detailed block diagram of the evaluation unit during $\Omega$ evaluation of the present invention set up to handle four words per clock.

FIG. 5 shows the connections for evaluating the $\Omega(x)$ polynomial using four words per clock. The actual connections in reference to comp unit 78 (FIG. 3) are as follows: multiplexor 98 couples the $\Omega(x)$ polynomial constant and multiplexor 102 couples the input a (current $\Omega(x)$ polynomial $\Omega_i$ from register file 82 of FIG. 1 or from register file 88 of FIG. 2 depending on the configuration) to the B and A inputs, respectively, of a general GF multiplier of general multiplier/adder 104 for forming a product. Input 0 is coupled to an adder (AD) input of general multiplier/adder 104 through a multiplexor 100 to be added with a product output from the general GF multiplier of general multiplier/adder 104. A sum output of general multiplier/adder 104 is current $\Omega_{i+1}$ polynomial (a). The current $\Omega_{i+1}$ polynomial (a) and the $\Omega(x)$ polynomial evaluation constant (either from register file 82 of FIG. 1 or from register file 88 of FIG. 2 depending on the configuration) are coupled as the A and B inputs, respectively, to the general GF multiplier of general multiplier/adder 108 for forming a product. The input 0 is coupled to the adder (AD) input of general multiplier/adder 108 through the multiplexor 110 to be added with the product output from the general GF multiplier of general multiplier/adder 108. The sum output of general multiplier/adder 108 is the current $\Omega_{i+2}$ polynomial (a). The current $\Omega_{i+2}$ polynomial (a) and the $\Omega(x)$ polynomial evaluation constant (either from register file 82 of FIG. 1 or from register file 88 of FIG. 2 depending on the configuration) are coupled as the A and B inputs, respectively, to the general GF multiplier of general multiplier/adder 112 for forming a product. The input 0 is coupled to the adder (AD) input of general multiplier/adder 112 through the multiplexor 114 to be added with the product output from the general GF multiplier of general multiplier/adder 112. The sum output of general multiplier/adder 112 is the current $\Omega_{i+3}$ polynomial (a). The current $\Omega_{i+3}$ polynomial (a) and the $\Omega(x)$ polynomial evaluation constant are coupled as the A and B inputs, respectively, to the general GF multiplier of general multiplier/adder 116 for forming a product. The input 0 is coupled to the adder (AD) input of general multiplier/adder 116 through the multiplexor 118 to be added with the product output from the general GF multiplier of general multiplier/adder 116. The sum output of general multiplier/adder 116 is coupled as the current $\Omega_{i+4}$ polynomial input of multiplexor 106. The multiplexor 106 output is coupled to replace the current $\Omega(x)$ polynomial data in register file 82 (or register file 88 of FIG. 2 depending on the configuration).

In evaluating the $\Omega(x)$ polynomial using only one word per clock the connections in comp unit 78 (FIG. 3) are as follows: multiplexor 98 couples the $\Omega(x)$ polynomial evaluation constant and multiplexor 102 couples the input a (current $\Omega_i$ polynomial from register file 82 of FIG. 1 or register file 88 of FIG. 2 depending on the configuration) to the B and A inputs, respectively, of the general GF multiplier of general multiplier/adder 104 for forming a product. The input 0 is coupled to the adder (AD) input of general multiplier/adder 104 through the multiplexor 100 to be added with the product output from the general GF multiplier of general multiplier/adder 104. The sum output of general multiplier/adder 104 is coupled as an input to multiplexor 106. Multiplexor 106's output is coupled to replace the $\Omega(x)$ polynomial data in register file 82.

Figure 6:
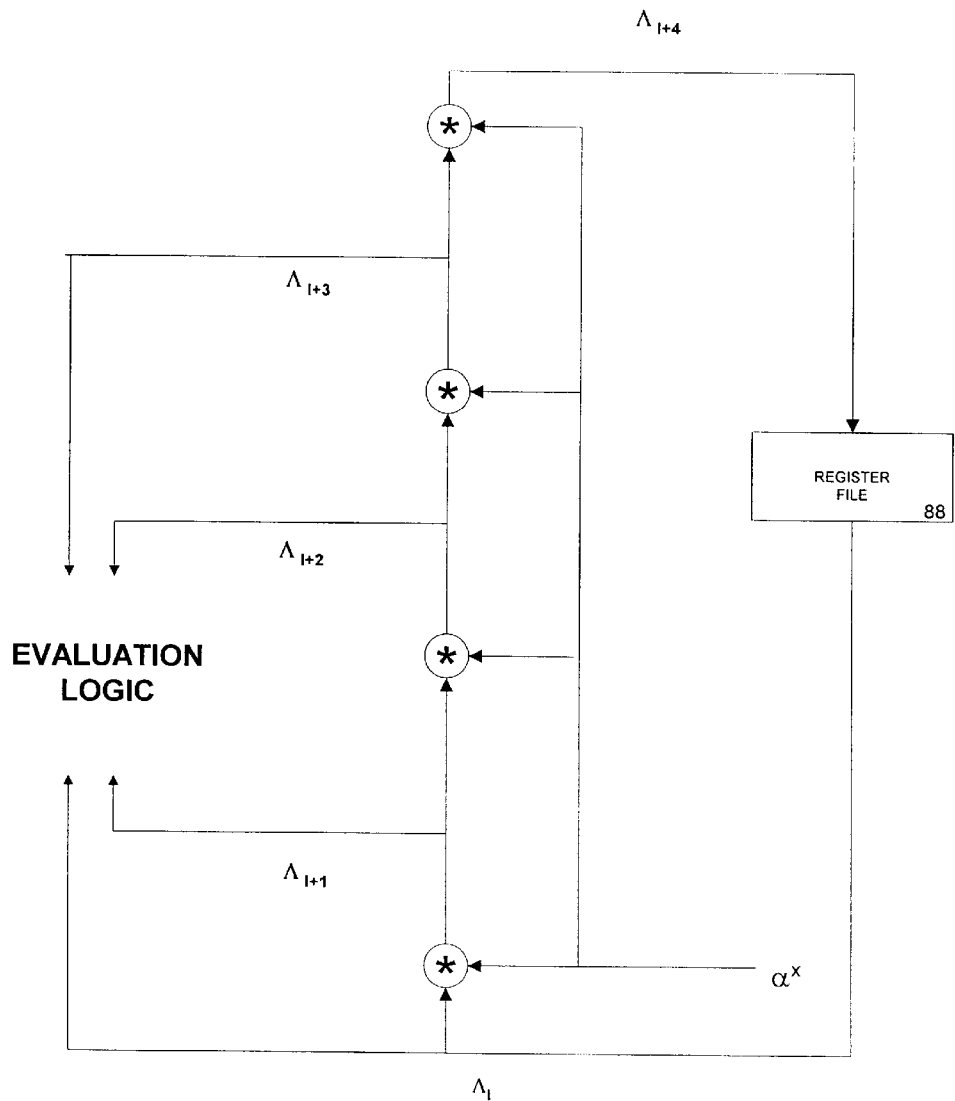
FIG. 6 is a more detailed block diagram of the evaluation unit during $\Lambda$ evaluation of the present invention set up to handle four words per clock.

FIG. 6 shows the connections for evaluating the $\Lambda(x)$ polynomial using four words per clock. The actual connections in reference to comp unit 78 (FIG. 3) are as follows: multiplexor 98 couples the $\Lambda(x)$ polynomial constant and multiplexor 102 couples the $\Lambda$ input a (current $\Lambda(x)$ polynomial $\Lambda_i$ either from register file 82 of FIG. 1 or register file 88 of FIG. 2 depending on the configuration) to the B and A inputs, respectively, of a general GF multiplier of general multiplier/adder 104 for forming a product. Input 0 is coupled to an adder (AD) input of general multiplier/adder 104 through a multiplexor 100 to be added with a product output from the general GF multiplier of general multiplier/adder 104. A sum output of general multiplier/adder 104 is current $\Lambda_{i+1}$ polynomial (a). The current $\Lambda_{i+1}$ polynomial (a) and the $\Lambda(x)$ polynomial evaluation constant (either from register file 82 or register file 88 of FIG. 2 depending on the configuration) are coupled as the A and B inputs, respectively, to the general GF multiplier of general multiplier/adder 108 for forming a product. The input 0 is coupled to the adder (AD) input of general multiplier/adder 108 through the multiplexor 110 to be added with the product output from the general GF multiplier of general multiplier/adder 108. The sum output of general multiplier/adder 108 is the current $\Lambda_{i+2}$ polynomial (a). The current $\Lambda_{i+2}$ polynomial (a) and the $\Lambda(x)$ polynomial evaluation constant (either from register file 82 or register file 88 of FIG. 2 depending on the configuration) are coupled as the A and B inputs, respectively, to the general GF multiplier of general multiplier/adder 112 for forming a product. The input 0 is coupled to the adder (AD) input of general multiplier/adder 112 through the multiplexor 114 to be added with the product output from the general GF multiplier of general multiplier/adder 112. The sum output of general multiplier/adder 112 is the current $\Lambda_{i+3}$ polynomial (a). The current $\Lambda_{i+3}$ polynomial (a) and the $\Lambda(x)$ polynomial evaluation constant (either from register file 82 or register file 88 of FIG. 2 depending on the configuration) are coupled as the A and B inputs, respectively, to the general GF multiplier of general multiplier/adder 116 for forming a product. The input 0 is coupled to the adder (AD) input of general multiplier/adder 116 through the multiplexor 118 to be added with the product output from the general GF multiplier of general multiplier/adder 116. The sum output of general multiplier/adder 116 is coupled as the current $\Lambda_{i+4}$ polynomial input of multiplexor 106. The multiplexor 106 output is coupled to replace the current $\Lambda(x)$ polynomial data in register file 82 (or register file 88 of FIG. 2 depending on the configuration). The evaluation logic circuit 158 (FIG. 8) is looking for the $\Lambda(x)$ polynomial being equal to zero.

In evaluating the $\Lambda(x)$ polynomial using only one word per clock the connections in comp unit 78 (FIG. 3) are as follows: multiplexor 98 couples the $\Lambda(x)$ polynomial constant and multiplexor 102 couples the input a (current $\Lambda_i$ polynomial from register file 82 of FIG. 1 or register file 88 of FIG. 2 depending on the configuration) to the B and A inputs, respectively, of the general GF multiplier of general multiplier/adder 104 for forming a product. The input 0 is coupled to the adder (AD) input of general multiplier/adder 104 through the multiplexor 100 to be added with the product output from the general GF multiplier of general multiplier/adder 104. The sum output of general multiplier/adder 104 is coupled as an input to multiplexor 106. Multiplexor 106's output is coupled to replace the $\Lambda(x)$ polynomial data in register file 82.

Figure 7A:
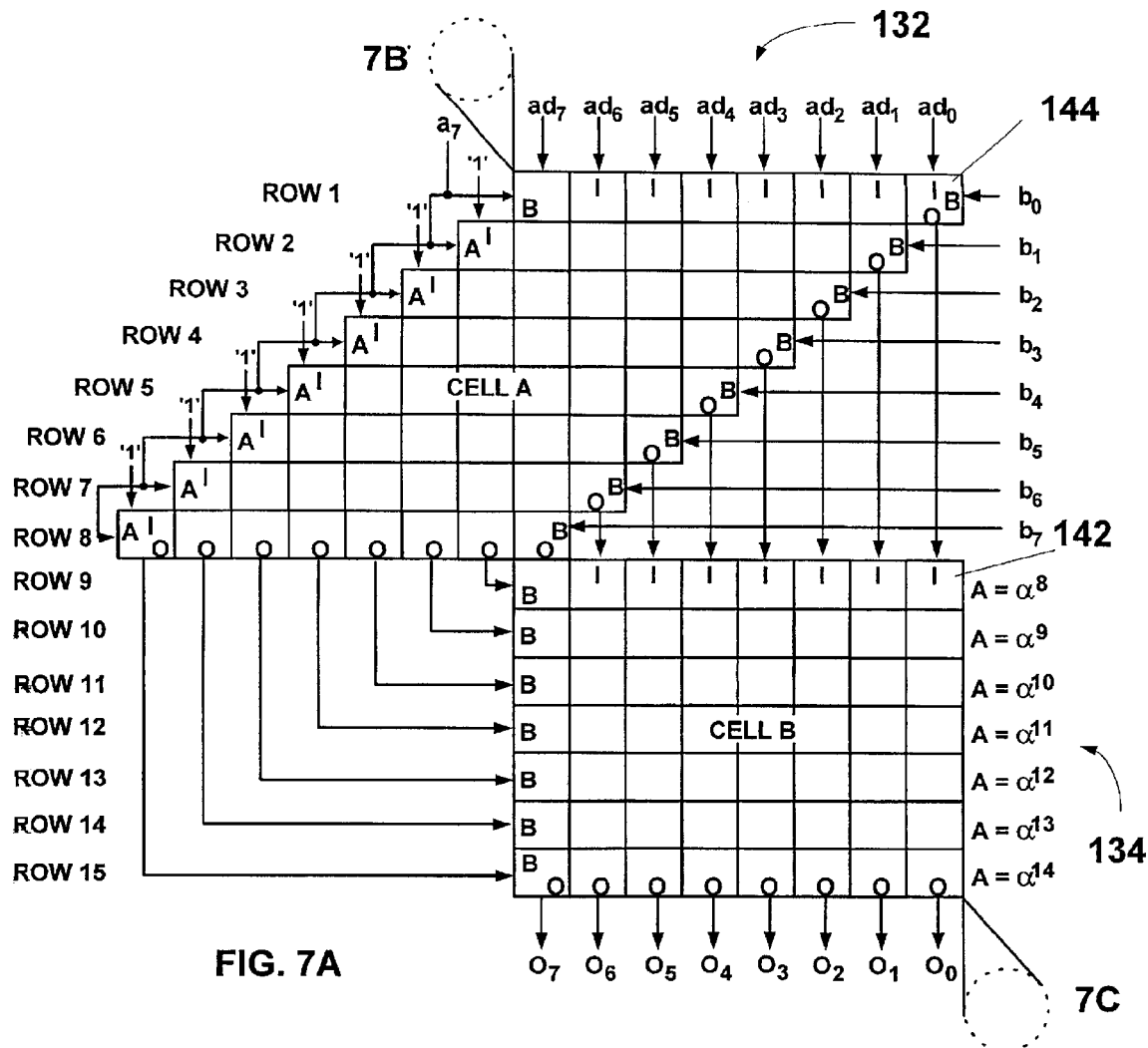
FIG. 7A is a block diagram of the general GF multiplier circuit of the present invention.

FIG. 7A shows a block diagram of the general GF multipliers of general multiplier/adders 104, 108, 112, and 116 of the present invention for the case of m=8 (i.e., 8-bit bytes). It should be clear to a person skilled in the art how this Figure would change for other values of m. While the physical structure of a general GF multiplier is non-directional, the descriptions herein are related to the orientation of the drawing. A general GF multiplier's upper half 132 is identical to the upper half of the general multiplier described in U.S. Pat. No. 5,396,502. In the upper left hand corner of upper half 132, a call out references FIG. 7B which will be described in detail below. A general GF multiplier's lower half 134 wherein the prior art the A inputs for rows 9, 10, ..., 15 were the coefficients of the GF elements $alhpa^8$, $alpha^9$, ..., $alpha^{14}$ respectively, has been redesigned allowing such coefficients to be generated "on the fly". In the lower right hand corner of lower half 134, a call out references FIG. 7C which will be described in detail below.

As stated above, the A inputs for rows 9, 10, ..., 15 were $alpha^8$, $alpha^9$, ..., $alpha^{14}$ in the hard coded versions of a GF polynomial in the prior art. The redesigned lower half 134 allows such coefficients to be generated "on the fly." Thus the generation of $alpha^8$, $alpha^9$, ..., $alpha^{14}$, is based on taking P(x) as an input. In this case:

$$X^8 = P(x)$$

$$X^9 = x\,P(x)$$

$$X^{10} = X^2 P(X)$$

Since multiplication is a simple shift, generating these values is easy, keeping in mind that every time the result extends outside the field, P(x) is added to the product. i.e. if (P(x)=10101010, $$xP(X) \text{ is } \frac{01010100}{11111110} \text{ and } x^2 P(x) \text{ is } \frac{11111110}{01010100}$$

In a bit by bit basis, this is achieved by the Cell B (FIG. 7C) circuit.

Where $P_i = i^{th}$ bit of P(x)

$B_i = i^{th}$ bit in the B row in constant row 8 from upper half 132.

$A_{i-1} = i^{th}$ bit in the $A^{th}$ row, the row before.

M=the most significant bit of $A^{th}$ row.

In a VLSI implementation, the circuit would be interwoven in the circuit performing the addition, in lower half of 134.

$O_i$ is the binary value of the $i^{th}$ term in the product polynomial.

$A_i$ is the constant value of the $i^{th}$ element in the field. It would be these $A_i$ terms that would be generated using the Cell B 136 circuit.

The general multiplier FIG. 7A forms a basis for allowing the decoding of RS codes of different types. RS codes are defined by certain parameters. These parameters include the P(x)—primitive polynomial, the primitive element and the generator polynomial G(x) all of which will be explained in more detail below.

RS codes are derived from GF arithmetic. Most cases are GF ($2^8$). This means that 8 bit numbers are used. A field is a closed number system where addition, subtraction, multiplication and division is defined. This means that any arithmetic operations (+, −, /, *) of two or more numbers has an answer in the field. P(x) sets the modulo operation for bringing answers that would end up outside the field back into the field. The following is an example of a multiplication:

Assuming: P(x)=10000111.10101010*00000010= 101010100 (simple shift) generates a 9 bit number.

In order to bring the numbers back into a 8 bit field (i.e. perform the modulo), take lower 8 bits and add P(x). It should be noted that the arithmetic operation of addition is performed by an exclusive OR when the order of the field is a power of 2.

```
  01010100
+ 10000111
  ---------
  11010011
```

The primitive element gives the order of the elements in the field. If alpha$^x$ is the primitive element (usually alpha$^1$= 00000010), in order to generate the field, alpha$^x$ is iteratively multiplied by the result of the previous product each time generating a new value until all 255 (in the case of GF $2^8$) elements have been generated. It should be noted that a primitive element is called such because it cycles the field without repeating values.

The generator polynomial G(x) actually defines the RS code (the primitive polynomial and the primitive element defined the Galois Field). The generator polynomial is usually in the following form:

G(x)=(alpha$^{j0}$+x)(alpha$^{j0+1}$+x) . . . (alpha$^{j0+2t-1}$+x) where j0 is an arbitrary value.

During encoding the data is divided by this polynomial and the remainder is used as parity bytes.

The $A^8$ . . . $A^{14}$ in the lower half of the multiplier 134 are generated "on the fly" using the logic shown by Cell B 136. For example, assume P(x)=10000111

$$\begin{aligned} \text{then } A^8 &= 10000111 \\ A^9 &= 00001110 \\ &+ 10000111 \\ &\overline{10001001} \end{aligned}$$

(shift once)(add P(x) because xP(x) is 9 bits).
It is assumed that P(x) can be changed through a register write or similarly.

Figure 7B:
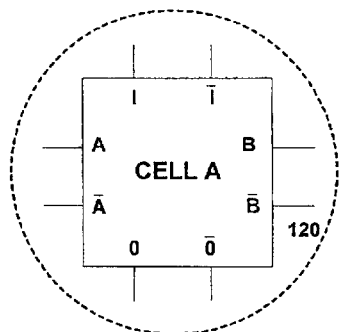
FIG. 7B is a block diagram of a single cell (Cell A) of the GF multiplier circuit of the present invention.

FIG. 7B shows an expanded view of a single Cell A 120 which is identical to the single Cell A described in Owsley, et. al U.S. Pat. No. 5,396,502 and is hereby incorporated by reference.

Figure 7C:
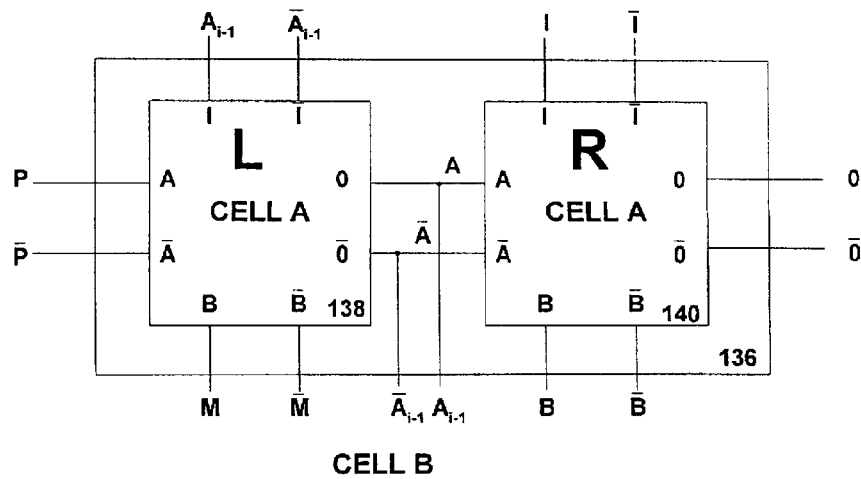
FIG. 7C is a block diagram of a single cell (Cell B) of the GF multiplier circuit of the present invention.

FIG. 7C shows an expanded view of a single Cell B 136. Cell B 136 is made up of two Cell As 138 and 140, respectively. Each Cell A 138 and 140 has six inputs: A, B, I and each of their respective complements. Each Cell A 138 and 140 includes three inverters to form the respective complements. Also, each Cell A 138 and 140 has two outputs, O and its complement.

The following description refers to the Cell A 138 of the Cell B 136 in the upper most left hand corner of lower half 134 as shown in FIG. 7A. In row 9 it is understood that P and $A_{i-1}$ are equal, therefore Cell A 138 receives P as the A input and also as the I input. Only the left hand side Cell A 138 receives the most significant bit from the A input from the Cell B above as the B input of Cell A 138. The O output of Cell A 138($A_i$) is coupled as the A input of Cell A 140. The B inputs to rows 9, 10, . . . , 15 are the outputs from row 8 from left to right, respectively. All the I inputs of Cell A 140 are connected to the O outputs of the cells immediately above. Thus, the I input to cell 142 as shown in FIG. 7A is the O output from the cell 144 above it. The result of the multiply and add corresponds to the outputs of the cells in row 15. Mathematically, this output is given by:

o(x)=[a(x)b(x)+ad(x)]:modulo p(x).

Figure 7D:
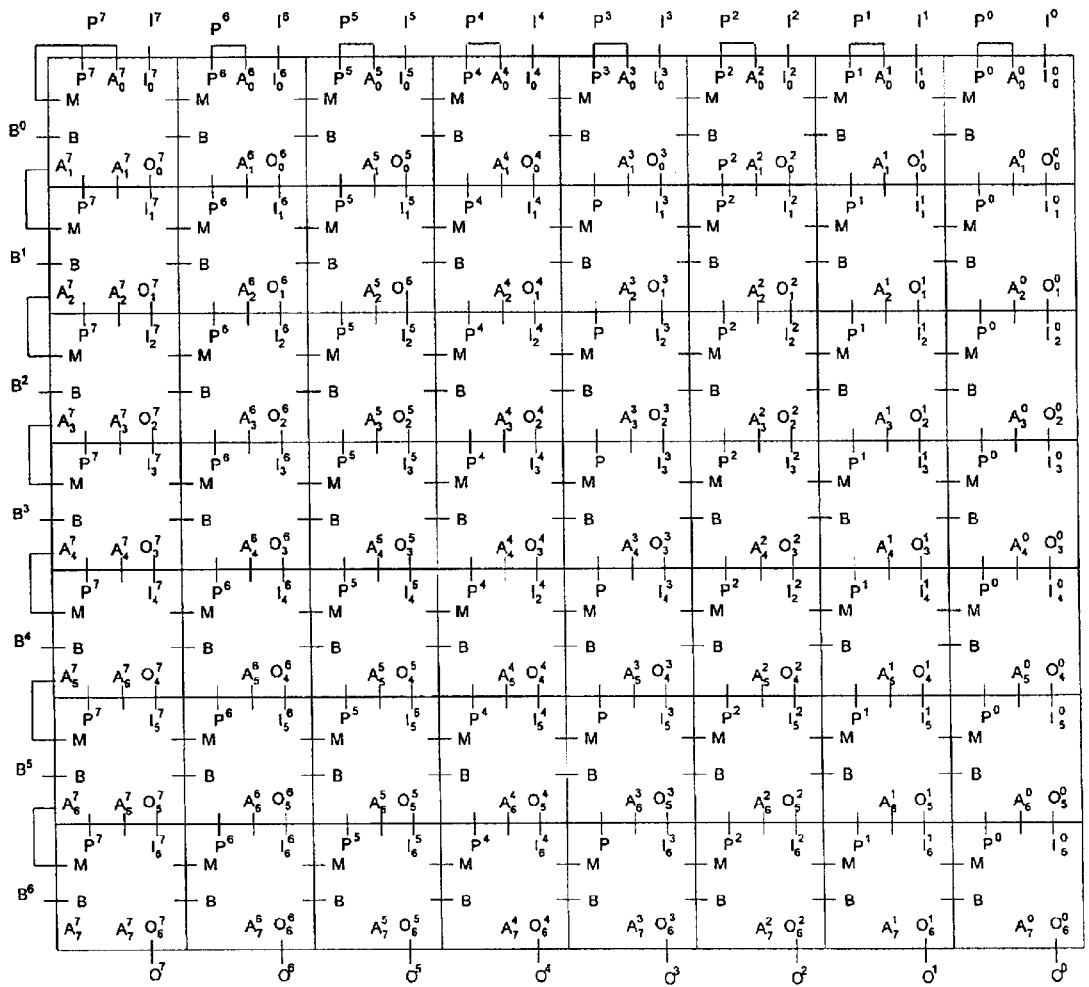
FIG. 7D is a more detailed block diagram of the lower half of the GF multiplier circuit of the present invention.

FIG. 7D shows a detailed block diagram of the lower half of the multiplier 134. All the input/output connections throughout the lower half of the multiplier 134 are shown.

Figure 8:
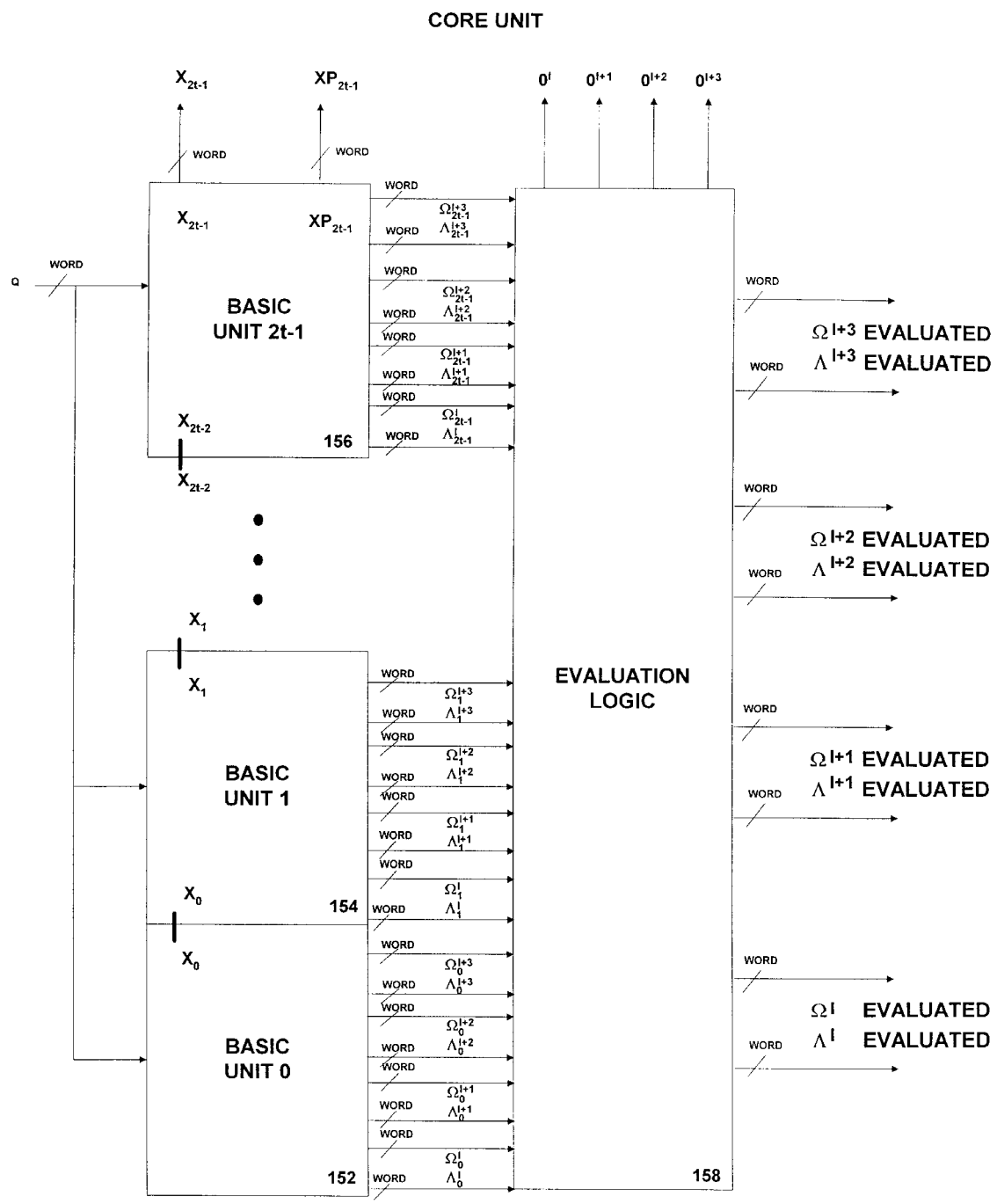
FIG. 8 is a block diagram of the error correction core of the present invention assuming 4 words are being decoded per clock.

FIG. 8 shows a more detailed block diagram of the comp unit 78 (FIG. 1). The Q input is coupled to basic units 152, 154 . . . 156 a word at a time (the circuit of the preferred embodiment is configured for GF(256)) and configured to handle four words per clock. Each basic unit i has an input Q and nine outputs $X_i, \Lambda_i^i, \Lambda_i^{i+1}, \Lambda_i^{i+2}, \Lambda_i^{i+3}, \Omega_i, \Omega_i^{i+1}, \Omega_i^{i+2}$, and $\Omega_i^{i+3}$. Each basic unit i is also coupled to receive the $X_{i-1}$ output except basic unit 0 152 which has only one input Q. The basic unit 2t-1 156 has an additional output $XP_{2t-1}$. Each of the basic units and outputs are coupled to an evaluation logic circuit 158 which has twelve outputs including the four evaluated $\Omega$(x) polynomials $\Omega^i$ to $\Omega^{i+3}$, the four evaluated $\Lambda'$(x) polynomial $\Lambda_i$ to $\Lambda^{i+3}$ and four ZERO signals ZERO$^i$ to ZERO$^{i+3}$.

Figure 9:
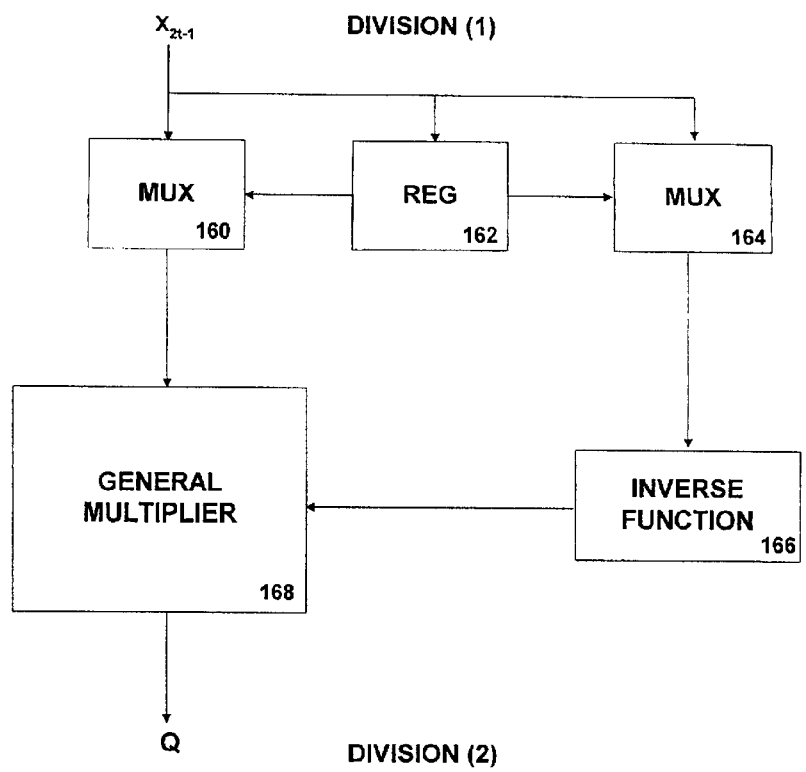
FIG. 9 is a block diagram of the Division (1) circuit of a second embodiment of the present invention.

FIG. 9 shows a block diagram of the Division (1) Unit 92 (FIG. 2). Register file 88 containing the word $X_{2t-1}$ is coupled to a multiplexor 160, a register 162 and another multiplexor 164 through the polygen 90 (FIG. 2). The output of the register 162, the word $X_{2t}$, is coupled to the multiplexor 160 and the multiplexor 164. The output of the multiplexor 164 is coupled to the inverse function circuit 166. The output of the inverse function circuit 166 and the output of the multiplexor 160 are each coupled to a general multiplier 168. The output of the general multiplier 168 is the word Q which is coupled to the polygen 90 (FIG. 2).

Figure 10:
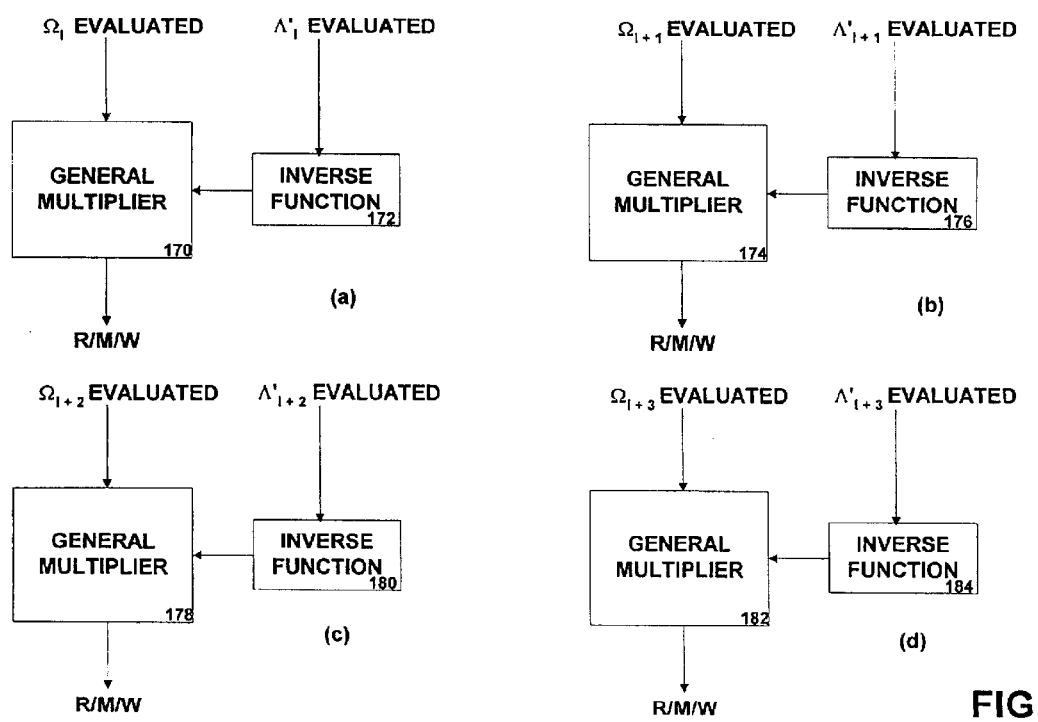
FIG. 10 is a block diagram of the Division (2) circuit of the second embodiment of the present invention.

FIG. 10 shows a block diagram of the Division (2) 96 (FIG. 2) using four words per clock. In a first embodiment, the evaluated $\Omega_i$(x) polynomial is coupled to the general multiplier 170. Additionally, the evaluated $\Lambda_i'$(x) polynomial is coupled to the inverse function circuit 172. The output of the inverse function circuit 172 is coupled to a general multiplier 170. The output of the general multiplier 170 is the R/M/W input coupled to the RAM 84 (FIG. 2).

In a second embodiment, the evaluated $\Omega_{i+1}$(x) polynomial is coupled to the general multiplier 174. Additionally, the evaluated $\Lambda_{i+1}'$(x) polynomial is coupled to the inverse function circuit 176. The output of the inverse function circuit 176 is coupled to a general multiplier 174. The output of the general multiplier 174 is the R/M/W input coupled to the RAM 84 (FIG. 2).

In a third embodiment, the evaluated $\Omega_{i+2}$(x) polynomial is coupled to the general multiplier 178. Additionally, the evaluated $\Lambda_{i+2}'$(x) polynomial is coupled to the inverse function circuit 180. The output of the inverse function circuit 180 is coupled to a general multiplier 178. The output of the general multiplier 178 is the R/M/W input coupled to the RAM 84 (FIG. 2).

In a fourth embodiment, the evaluated $\Omega_{i+3}$(x) polynomial is coupled to the general multiplier 182. Additionally, the evaluated $\Lambda_{i+3}'$(x) polynomial is coupled to the inverse function circuit 184. The output of the inverse function circuit 184 is coupled to a general multiplier 182. The output of the general multiplier 182 is the R/M/W input coupled to the RAM 84 (FIG. 2).

Figure 11:
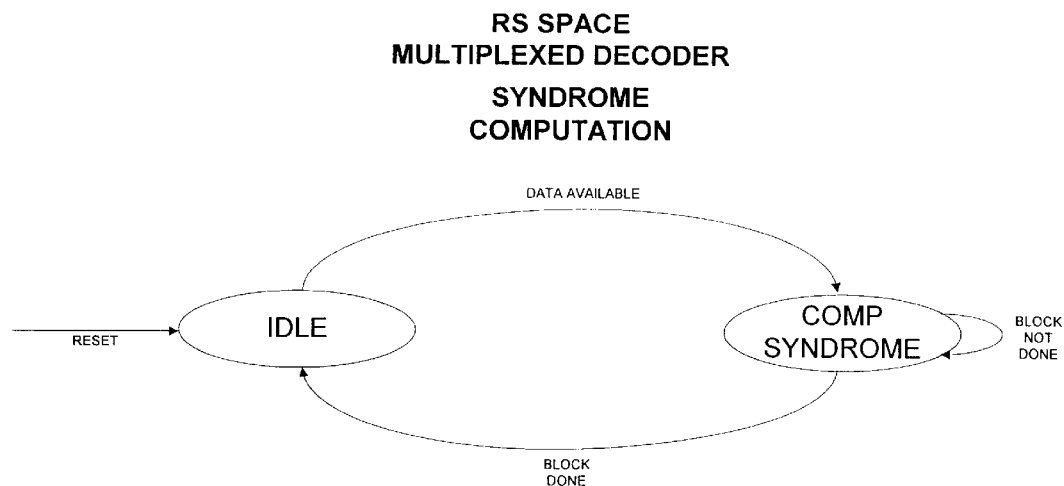
FIG. 11 is a state diagram of the RS space-multiplexed decoder showing the state of the circuit of the present invention during syndrome computation.
Figure 12:
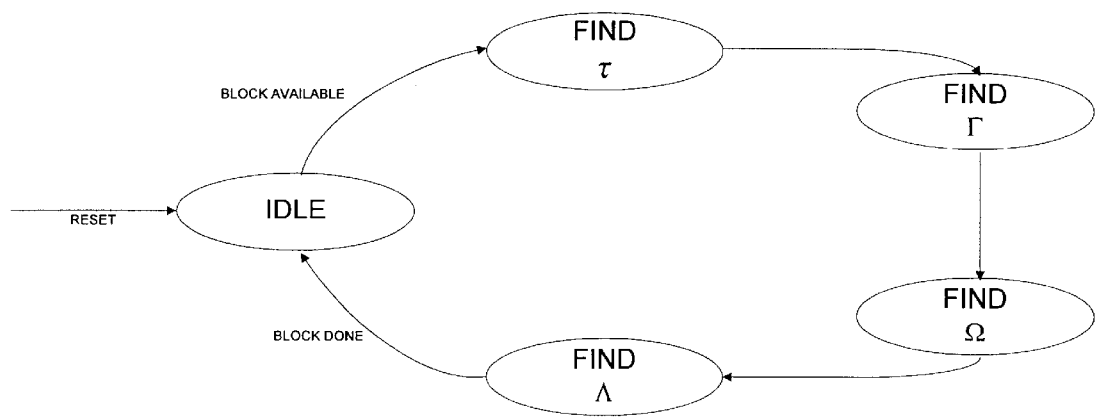
FIG. 12 is a state diagram of the RS space-multiplexed decoder showing the state of the circuit of the present invention during polynomial generation.
Figure 13:
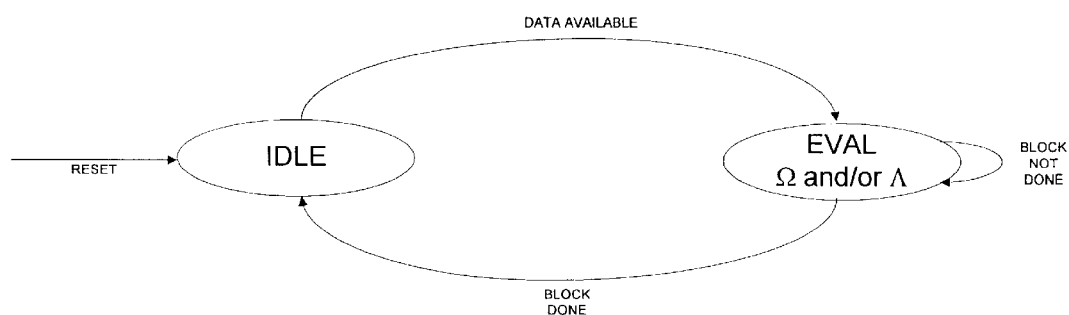
FIG. 13 is a state diagram of the RS space-multiplexed decoder showing the state of the circuit of the present invention during $\Omega$ and/or $\Lambda$ evaluation.

FIGS. 11–13 show the state machines associated with the space-multiplexed embodiment of the present invention. FIG. 11 shows the state diagram of the present invention for syndrome computation. During a computation state a counter is running to count the words in a block. When the count expires, a signal is output to the next computation unit (Polynomial Generation) that a block is done. The next block (if available) is started. The output of this block being stored in a different register file location. Erasures are stored in the register file as data is received.

FIG. 12 shows the state diagram of the present invention for polynomial generation. The polynomial generation unit will go through finding the needed polynomials. In simple form: finding Tau and Gamma involves multiplying the syndrome polynomial by the roots of the erasure polynomial. During the finding of $\Omega$, the quotient (Q) is stored to be reused while finding $\Lambda$.

When all the calculations are complete for a block, a signal is passed to the evaluation unit to signal that the next block is available. The same signal marks that a new block can be started if the syndrome computation unit has finished its block.

FIG. 13 shows the state diagram of the present invention for the evaluation unit. While in the evaluation unit a counter is counting to see when a block is done. For each step, a zero detect circuit checks if $\Lambda(i)$ equals zero. If so, $\Omega(i)$ and $\Lambda'(i)$ is passed to Division (2).

Figure 14:
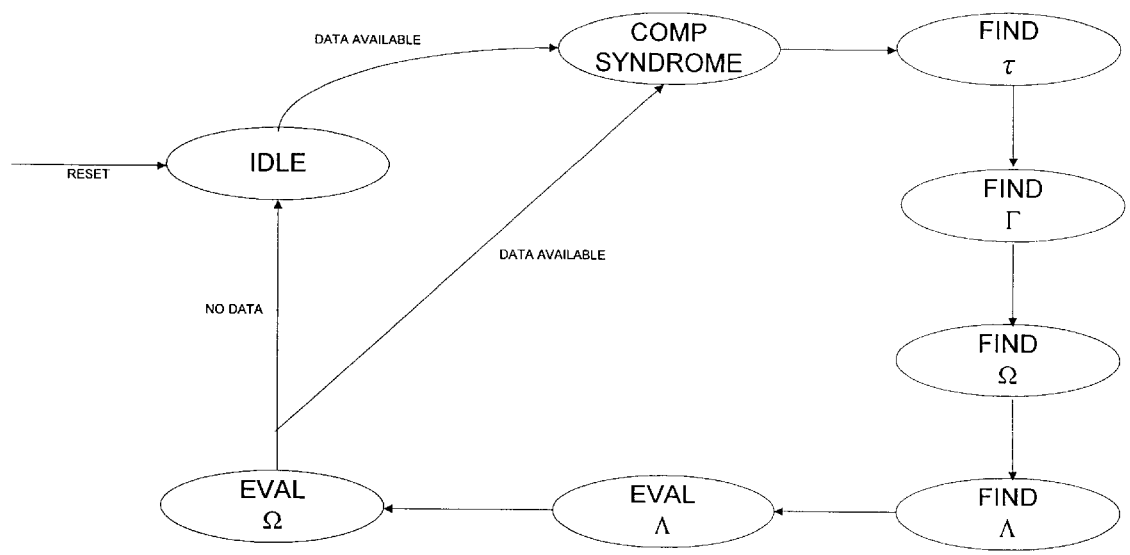
FIG. 14 is a state diagram of the RS time-multiplexed decoder showing the state of the circuit of the present invention during syndrome computation, polynomial generation, and $\Omega$ and/or $\Lambda$ evaluation.

FIG. 14 shows the state diagram of the present invention for an RS time-multiplexed decoder. It has all of the elements from the circuit described above. The state diagrams remain the same whether one or more words are handled per clock. Parallel combinations are possible to shorten the decode time. As an example, doing "evaluate $\Omega$" and "evaluate $\Lambda$" in parallel will shorten the decode time at the cost of extra circuitry.

Circuit Operation

In the preferred embodiment, a runtime programmable RS decoder is utilized for resolving the polynomials. The circuitry is reconfigurable as described above to initialize it for performing each of the intended functions. The computations are carried out in sequence, with the circuitry initialized according to which polynomial is being computed.

In the first embodiment of the RS time-multiplexed decoder (FIG. 14) all calculations are made utilizing a single register file, a single computation unit consisting of multipliers and adders and multiplexors, and a single division unit (FIG. 1). In the second embodiment of the present invention the tasks are divided for the RS space-multiplexed decoder (FIGS. 11–13). There are separate syndrome computation unit, polynomial generation unit, and evaluator unit. The Division Unit 80 (FIG. 1) is split into Division (1) 92 (FIG. 2) and Division Unit (2) 96 (FIG. 2). It would be clear to a person skilled in the art how to join any two of the computation units in the second embodiment as to form a variation thereof. For example, one would combine the Evaluator and Syndrome computation units since these perform very similar functions.

Thus in either embodiment decoding of an RS code block will be sped up by a considerable amount. In fact, the decoding speed can be improved, in the limit, to the time it takes to generate the $\Omega$ and $\Lambda$ polynomials. The tradeoff is time versus space. For example, each partial syndrome can be generated in one clock cycle. That would require N multiplies and adds per partial syndrome. It can be seen that a completely space multiplexed circuit would require a lot of silicon area, as well as requiring that the clock cycle be very long. However, generating the partial syndromes, having three to five multipliers, would speed the decode time by three to five times but still allow the clock speed to be reasonable.

Following are examples of how the present invention would speed the decode time. All RS decoders go through the following steps for each received code block:
1. Syndrome generation
2. Solve Key Equations ($\Omega$ and $\Lambda$)
3. Evaluate Polynomials ($\Omega$ and $\Lambda$)
4. Correct.

Based on this, one skilled in the art can make trade-offs of time versus space in a decoding circuit. One extreme would be to build a circuit that can do each of the steps and time multiplex these. The other extreme is to design circuitry for each step and work on several blocks at a time. The latter has higher throughput than the former, but requires about three times the circuitry. FIG. 3 shows an alternate way of generating the syndromes. This provides yet another implementation option to the time versus space trade-off. The circuit shows the ability to compute syndromes by processing multiple words at a time. This, of course, increases the throughput by the factor of how many words are processed per clock. As a result, the time multiplex embodiment can be modified to process data N times faster depending on how many words are handled per clock. Example based on prior art time-multiplexed decoder:
1. Generate syndromes=N clocks (N=number of words)
2. Solve key equations for $\Omega$=2R clocks
3. Solve key equation for $\Lambda$=2R clocks
4. Evaluate $\Omega$=N clocks
5. Evaluate $\Lambda$=N clocks
   Total=3N+4R clocks Assuming the correction is done during 4 and 5, no additional time required for correction. Example based on present invention able to operate on 2 words per clock.
1. Generate syndromes=N/2 clocks
2. Solve key equations for approximately=2R clocks
3. Solve key equation for=2R clocks
4. Evaluate $\Omega$=N/2 clocks
5. Evaluate $\Lambda$=N/2 clocks
   Total=(3/2)N+4R clocks.

From this it is evident that:
   3 words per clock would equal N+4R clocks
   4 words per clock would equal (3/4)N+4R clocks and so on.

Many current applications have relatively low data rates. Often the system is bit serial and thus one word is processed every 8 clocks. In that case, the totally time-multiplexed solution is best. However, as data rates are increased and in systems where data is transmitted in parallel, solutions where more than one word is being operated on at a time will be required.

The conventional prior art time-multiplexed circuit handles all 5 steps. The circuit required the following hardware per parity word: three registers, four multiplexors, one constant multiplier and one general multiplier/adder.

The conventional prior art space-multiplexed circuit required the following hardware per parity word (assuming only capable of handling a single RS code): seven registers, six multiplexors, two general multipliers/adders and three constant multipliers.

The present invention FIG. 1 (shown capable of handling 4 words per clock) capable of choosing RS code after the circuit has been implemented requires only the following hardware per parity word; six registers in a common register file, seven multiplexors and four general multipliers/adders.

If the conventional prior art space-multiplexed circuit were to be modified to be field/programmable then it would require the following hardware per parity word; ten registers, three multiplexors and five general multipliers/adders.

One skilled in the art could combine subcomponents of the conventional prior art space-multiplexed circuit with subcomponents of the present invention shown in FIG. 1 to speed up the decode further. For instance, if the $\Omega$ and $\Lambda$ polynomials were solved using the appropriate portion of the conventional prior art space-multiplexed circuit and the syndromes, and $\Omega$ and $\Lambda$ generated and evaluated using the comp unit as shown in FIG. 3 with 3 words being handled per clock, the time to decode becomes:

1. Generate syndromes=N/3 clocks
2. Solve key equations for approximately=2R clocks
3. Solve key equation for=2R clocks
4. Evaluate Ω=N/3 clocks
5. Evaluate Λ=N/3 clocks Total=N+4R clocks.

This is assuming the generation of Ω and Λ are done in parallel so no extra time required. The hardware required to have the on-the-fly random generation capability of an RS code in combination with the conventional prior art would be as follows: From the conventional prior art: 4 registers, 6 multiplexors, 2 general multiplier/adder From present invention: 1 register, 7 multiplexors, 3 general multipliers/adders*

Total: 5 registers, 13 multiplexors, 5 general multipliers/adders

This compares quite favorably to the 10 registers, 3 multiplexors and 5 general multipliers/adders required for a general purpose decoder of the prior art.

* The register in the above example can hold the syndrome for a block, hold Ω for another block, and hold Λ for the same block as Ω.

The benefit of the present invention is that there are no extra registers required as there would be in the prior art space-multiplexed system. Since data is coming from several blocks, a single register file could be used to keep these pieces of information. A properly implemented register file is more compact and would allow some of the multiplexors to be removed since data would be read directly from the register file and the selection would be made by the addressing of the file. The following inputs are read from the register file during polynomial generation;

$S_{(x)}$ — syndrome 2$t$ words $S_c$ — syndrome constants ($\alpha^{j0+i}$)

$\Omega_i$ — current value of during generation $\Omega_{i-1}$ — last value during generation $\Lambda_i$ — current during generation, $\Lambda_{i-1}$ — not needed.

$\Omega_x$ — current during evaluation $\Omega_x$ — current during evaluation $Z$ — all zeros.

Depending on how close to the "block time" the "decode time" is, copies of these for more than one block may be needed. Block time is the time needed to receive a block from the channel. Decode time is the time needed to decode a block.

The entire Runtime Programmable RS decoder is data driven. This means that no calculations are performed when no data is present. This in turn implies that the circuitry remains in a low-power mode when it is not being used, thus limiting the loading of the power source. This is important if, for example, the system is powered using a battery.

The invention is only limited by what is practical to implement in silicon. The drawings and text refer to 8 bit symbols; however, that is only due to the commonality of 8 bit symbol RS codes. The invention is valid for any M (though the practicality of codes with huge words is questionable).

There is also a limitation as to the maximum error correcting capability of the codes that are used. The register file described only handles one set of variables and constants. If the register file was doubled in size (and the control changed to allow it), the circuit could deal with codes with twice as many check bytes (and thus correct twice as many errors). Also, the number of words stored per row will limit the number of check words that are handled. It is noteworthy that it is possible to have a decoder that is fully programmable in all aspects except $R_{max}$. Where $R_{max}$ is the number of check bytes.

What is claimed is:

1. A Reed-Solomon decoder circuit for resolving a syndrome polynomial, an OMEGA(x) polynomial, a LAMBDA(x) polynomial, a LAMBDA'(x) polynomial, and for evaluating the OMEGA(x) polynomial, and evaluating the LAMBDA(x) polynomial, each of these polynomials having a plurality of coefficients, the circuit comprising:

a plurality of units selectively controllable for:
first resolving coefficients of the syndrome polynomial, then corresponding coefficients of the OMEGA(x) polynomial,
followed by corresponding coefficients of the LAMBDA(x) polynomial,
wherein the polynomials have a plurality of data bytes which can be resolved multiple bytes at a time.

2. The circuit according to claim 1 wherein one of the units is a time multiplexed computation unit.

3. The circuit according to claim 1 wherein one of the units is a space multiplexed computation unit.

4. The circuit according to claim 3 wherein one of the units is a syndrome computation unit.

5. The circuit according to claim 3 wherein one of the units is an polynomial generation unit for generating the OMEGA(x) polynomial, and the LAMBDA(x) polynomial.

6. The circuit according to claim 3 wherein one of the units is an evaluator unit for evaluating the OMEGA(x) polynomial, and evaluating the LAMBDA(x) polynomial.

7. The circuit according to claim 6 wherein a primitive element or the field is used to program the Reed-Solomon code after the circuit has been implemented.

8. The circuit according to claim 3 wherein two of the units are division units,
a first division unit coupled to the circuit to provide a byte Q used in generating the OMEGA(x) polynomial and the LAMBDA(x) polynomial, and
a second division unit coupled to the circuit to output a decoded RS code block.

9. The circuit according to claim 3 wherein the space multiplexed computation unit includes:
a register file,
a syndrome computation unit operationally coupled to the register file,
a polynomial generation unit operationally coupled to the register file,
an evaluator unit operationally coupled to the register file,
a first division unit operationally coupled to the polynomial generation unit, and
a second division unit operationally coupled to the evaluator unit,
wherein the space multiplexed computation unit provides as an output a decoded RS code block.

10. The circuit according to claim 1 wherein a subcomponent of one of the units is a programmable two stage general Galois Field multiplier.

11. The circuit according to claim 1 wherein said circuit contains a register file unit which stores data and intermediate syndrome, OMEGA(x) and LAMBDA(x) polynomials.

12. The circuit according to claim 1 wherein a division unit resolves the evaluated OMEGA(x) polynomial, and evaluated LAMBDA(x) polynomial.

13. The circuit according to claim 1 wherein a Reed-Solomon code is programmable after the circuit has been implemented.

14. The circuit according to claim 1 wherein the errors are corrected in the order in which the bytes are received by the circuit.

15. The circuit according to claim 1 further comprising automatic means for activating the circuit only while data is present.

16. The circuit according to claim 1 wherein the plurality or units art reconfigurable to perform a plurality of functions, the plurality of units include;
- a time multiplexed computation unit, including multiplexors and general multiplier/adders, operationally coupled to a division unit,
  - wherein the time multiplexed computation unit receives as an input an encoded RS code block of multiple bytes or data during one clock cycle and provides as an output the evaluated OMEGA(x) polynomial and the evaluated LAMBDA(x) polynomial, and
  - wherein the division unit provides as an output to the time multiplexed computation unit a byte Q used in generating the OMEGA(x) polynomial and the LAMBDA(x) polynomial and receives as inputs from the time multiplexed computation unit, the evaluated OMEGA(x) polynomial and the evaluated LAMBDA(x) polynomial used in generating an output of a decoded RS code block.

17. The circuit according to claim 16 wherein the general multiplier/adders are configured when more than one word is handled per clock cycle, an output of a previous general multiplier/adder is coupled as an input of a subsequent general multiplier/adder, wherein only an output of a last general multiplier/adder is output as an output of the time multiplexed computation unit.

18. A Reed-Solomon decoder circuit for resolving a syndrome polynomial, an OMEGA(x) polynomial, a LAMBDA(x) polynomial, a LAMBDA'(x) polynomial, evaluated OMEGA(x) polynomial, and evaluated LAMBDA(x) polynomial, each of these polynomials having a plurality of coefficients, the circuit having comprising:
- a plurality of subcircuits wherein each subcircuit is selectively controllable for:
  - first resolving coefficients of the syndrome polynomial, then corresponding coefficients of the OMEGA(x) polynomial,
  - followed by corresponding coefficients of the LAMBDA(x) polynomial,
  - wherein the polynomials have a plurality of data bytes which can be resolved multiple bytes at a time and
  - at least one component of the subcircuits is a programmable two stage general Galois Field multiplier.

19. The circuit according to claim 18 wherein a primitive element of the field is used to program the two stage general Galois Field multiplier after the circuit has been implemented.

20. A programmable two stage general Galois Field multiplier comprising a first stage and a second stage,
- wherein a primitive element of the field is used to program the second stage of the programmable two stage general Galois Field multiplier with a Reed-Solomon code after a Reed-Solomon decoder circuit has been implemented to resolve a syndrome polynomial, an OMEGA (x) polynomial, a LAMBDA(x) polynomial, a LAMBDA'(x) polynomial, evaluated OMEGA(x) polynomial, and evaluated LAMBDA(x) polynomial.

* * * * *